(12) United States Patent
Lee

(10) Patent No.: US 7,457,190 B2
(45) Date of Patent: Nov. 25, 2008

(54) DATA LATCH CONTROLLER OF SYNCHRONOUS MEMORY DEVICE

(75) Inventor: Geun Il Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 227 days.

(21) Appl. No.: 11/477,883

(22) Filed: Jun. 29, 2006

(65) Prior Publication Data

US 2007/0014164 A1 Jan. 18, 2007

(30) Foreign Application Priority Data

Jun. 30, 2005 (KR) .................... 10-2005-0058129

(51) Int. Cl.
*G11C 8/00* (2006.01)
(52) U.S. Cl. .................... 365/233; 365/193; 365/194
(58) Field of Classification Search ................ 365/233, 365/193, 194, 163, 154, 233.5, 189.05, 227, 365/189.09, 191
See application file for complete search history.

(56) References Cited

U.S. PATENT DOCUMENTS 7,042,799 B2 * 5/2006 Cho ..................... 365/185.17

| | | | |
|---|---|---|---|
| 2004/0218429 A1 * | 11/2004 | Shim ..................... | 365/194 |
| 2006/0215467 A1 * | 9/2006 | Partsch ................... | 365/194 |
| 2007/0002644 A1 * | 1/2007 | Kang ..................... | 365/193 |
| 2007/0282555 A1 * | 12/2007 | Chong et al. ............. | 702/107 |

FOREIGN PATENT DOCUMENTS

KR 2002-0086197 11/2002

* cited by examiner

*Primary Examiner*—Dang T Nguyen
(74) *Attorney, Agent, or Firm*—Ladas & Parry LLP

(57) ABSTRACT

Disclosed is a data input circuit of a synchronous memory device for detecting and amplifying data, and transferring the amplified data for storage, which including: a write strobe signal converter for receiving a write strobe signal, dividing the received write strobe signal, and outputting control signals of predetermined bits, the control signals being synchronized with rising and falling edges of the divided signal; and a latch unit for latching data corresponding to the bits by means of the control signals, and outputting the data for the detection and amplification of the data. The data input circuit may include a first delay unit for delaying the data in order to match setup-hold time, a second delay unit for performing delay for adjusting the data outputted from the latch unit, and a third delay unit for performing delay for adjusting the write strobe signal outputted from the latch unit.

3 Claims, 6 Drawing Sheets

US 7,457,190 B2

DATA LATCH CONTROLLER OF SYNCHRONOUS MEMORY DEVICE

BACKGROUND OF THE INVENTION

1. Field of the Invention

The present invention relates to a data input circuit of a synchronous memory device, and more particularly to a data input circuit of a synchronous memory device, in which a data strobe signal can be used for a latch in a state of ensuring a full swing in a ultra high speed synchronous memory device.

2. Description of the Prior Art

A Double Data Rate (DDR) 2 Synchronous Dynamic Random Access Memory (SDRAM), which is a high speed synchronous memory device, represents a volatile memory device for storing data in a cell including one transistor and one capacitor. A DDR2 SDRAM synchronizes with an external clock signal to perform an internal operation, and performs a data write/read operation in a 4-bit prefetch scheme.

Hereinafter, an operation in which the memory device synchronizes with an external clock signal to write data in a 4-bit prefetch scheme will be described with reference to FIGS. 1 and 2.

A data input buffer 100 is a circuit for converting data inputted through a data pin (DQ) to data of a CMOS level. A delay unit 110 is a circuit for delaying the data outputted from the data input buffer 100 for a predetermined time period. An input data latch unit 120 is a circuit for latching the data outputted from the delay unit 110, and latches 4-bit data in a 4-bit prefetch operation.

A WDQS buffer 150 is a circuit for converting a write strobe signal WDQS applied from a memory controller to a signal of a CMOS level. The write strobe signal WDQS represents a data strobe signal applied in a write operation. A delay unit 160 delays the write strobe signal WDQS outputted from the WDQS buffer 150 for a predetermined time period, and outputs both a rising strobe signal rdqs synchronized with the rising edge of the write strobe signal WDQS and a falling strobe signal fdqs synchronized with the falling edge of the write strobe signal WDQS.

The input data latch unit 120 synchronizes with the rising strobe signal rdqs and the falling strobe signal fdqs, and sequentially latches the data.

The 4-bit data stored in the input data latch unit 120 are transferred to an input data detection amplifier 130 through internal lines align 00, align 01, align 10 and align 11. The input data detection amplifier 130 amplifies the 4-bit data respectively in response to a data input strobe signal Dinstrobe, and applies the amplified data to a write driver 140. The write driver 140 stores the amplified data in a memory cell.

FIG. 2 is a waveform illustrating an operation of the data input unit of the memory device in FIG. 1.

Referring to FIG. 2, an "Ext clk" represents an external clock signal applied to the memory device. A "WDQS" is the write strobe signal, which represents a signal applied after predetermined time "tDQSS" from the time point at which a write command is applied. The "tDQSS" corresponds to about 0.75 tCK~1.25 tCK (tCK represents a period of the "Ext clk") after the write command is applied. FIG. 2 shows 8-bit data continuously applied through one data pin. Specifically, a "tDS" represents setup time and a "tDH" represents hold time.

In the 4-bit prefetch operation, the 4-bit data, which have been respectively synchronized with the rising edges a and c and the falling edges b and d of the write strobe signal WDQS, are aligned to the falling edge d and applied to the input data detection amplifier 130. Likewise, next 4-bit data are synchronized and aligned in the same manner and then applied to the input data detection amplifier 130. The 4-bit data applied in parallel to the input data detection amplifier 130 are synchronized with the data input strobe signal Dinstrobe and then applied to the write driver 140.

However, increase in the operation speed of the memory device causes the following problems.

FIGS. 3a and 3b are diagrams illustrating transformation of a clock signal in a high frequency operation.

As an operation frequency increases, the waveform of the write strobe signal WDQS transferred to the input data latch unit 120 via the delay unit 160 is transformed into an abnormal waveform as illustrated in FIG. 3b instead of a normal waveform as illustrated in FIG. 3a. This is because a transmission line for connecting the delay unit 160 to the input data latch unit 120 has a heavy load. Specifically, when the load of the transmission line increases, an RC delay also increases. Therefore, the signal may be distorted.

If the write strobe signal WDQS having the abnormal waveform as illustrated in FIG. 3b is applied to the input data latch unit 120, a desired operation cannot be performed. That is, the input data cannot be exactly latched and be aligned at an exact time point. As a result, the input data cannot be normally written.

SUMMARY OF THE INVENTION

Accordingly, the present invention has been made to solve the above-mentioned problems occurring in the prior art, and an object of the present invention is to provide a signal generator available for a high speed memory device, thereby allowing a data latch operation to be performed in the high speed memory device.

Another object of the present invention is to divide the frequency of an external input clock signal into ½ and use the divided clock signal as an internal control signal, thereby allowing a data latch operation to be performed in the high speed memory device.

In order to achieve the above objects, according to one aspect of the present invention, there is provided a data input circuit of a synchronous memory device for detecting and amplifying data, and transferring the amplified data for storage, the data input circuit including: a write strobe signal converter for receiving a write strobe signal, dividing the received write strobe signal, and outputting control signals of predetermined bits, the control signals being synchronized with rising and falling edges of the divided signal; and a latch unit for latching data corresponding to the bits by means of the control signals, and outputting the data for the detection and amplification of the data.

It is preferred that the write strobe signal converter includes: a first signal generator for dividing the write strobe signal into ½ with reference to the rising and falling edges of the write strobe signal; and a second signal generator for generating the control signals respectively synchronized with the rising and falling edges of the divided signal.

The first signal generator includes: a first flip-flop for outputting the signal synchronized with the rising edge of the write strobe signal; a first inverter for inverting the write strobe signal; and a second flip-flop for receiving the inverted write strobe signal, and outputting the signal synchronized with the falling edge of the write strobe signal.

The second signal generator includes: a second inverter for inverting and outputting the signal synchronized with the rising edge of the write strobe signal; a first switching element for delaying the signal synchronized with the rising edge of the write strobe signal by delay time of the second inverter, and outputting the delayed signal; a third inverter for inverting and outputting the signal synchronized with the falling edge of the write strobe signal; and a second switching element for delaying the signal synchronized with the falling edge of the write strobe signal by delay time of the third inverter, and outputting the delayed signal.

The present invention further includes a first delay unit for delaying the data in order to match setup-hold time, and providing the delayed data to the latch unit.

The present invention further includes a second delay unit for performing delay for adjusting the data outputted from the latch unit so that the data correspond to an input time point of a data input strobe signal to be provided for the detection and amplification.

The present invention further includes a third delay unit for performing delay for adjusting the write strobe signal outputted from the latch unit so that the write strobe signal correspond to an input time point of a data input strobe signal to be provided for the detection and amplification, and providing the delayed signal to the write strobe signal converter.

It is preferred that the write strobe signal converter divides the data strobe signal into ½.

It is preferred that the write strobe signal converter outputs the control signal such that a high level interval of the control signal is maintained for a time period for which a high level interval of the write strobe signal is maintained.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
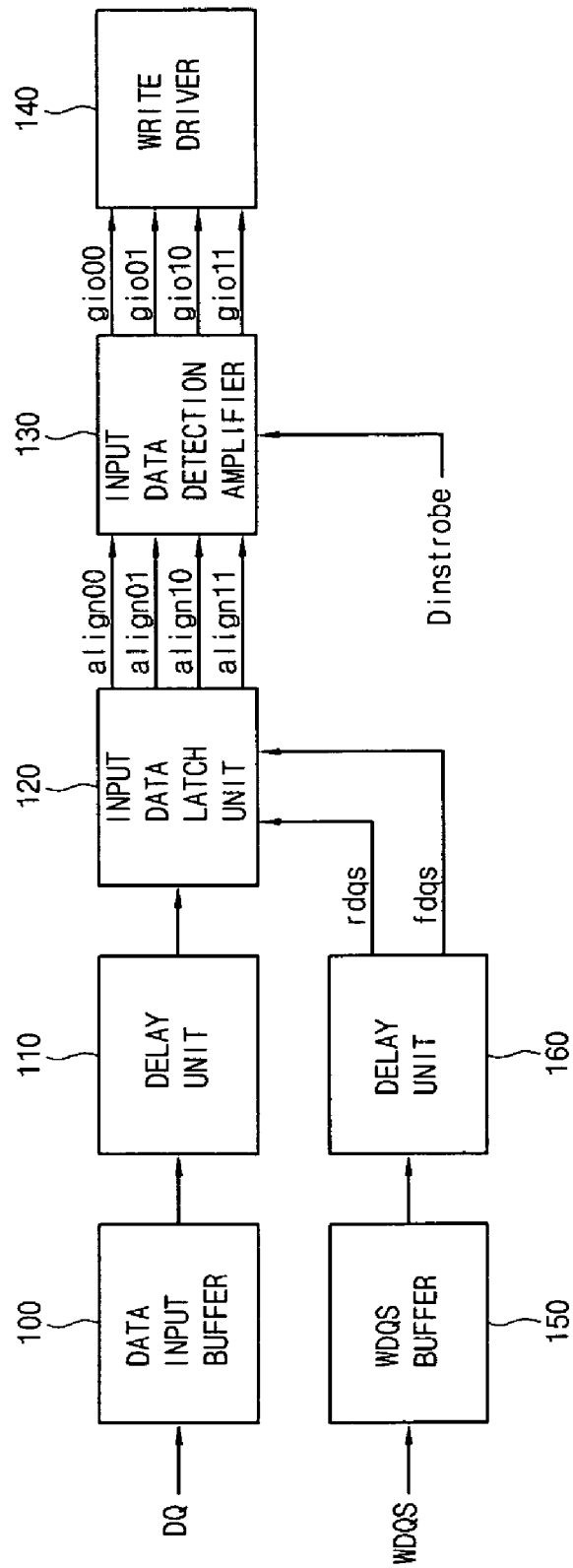
FIG. 1 is a block diagram of a data input circuit in a memory device for performing a write operation in a 4-bit prefetch scheme.
Figure 2:
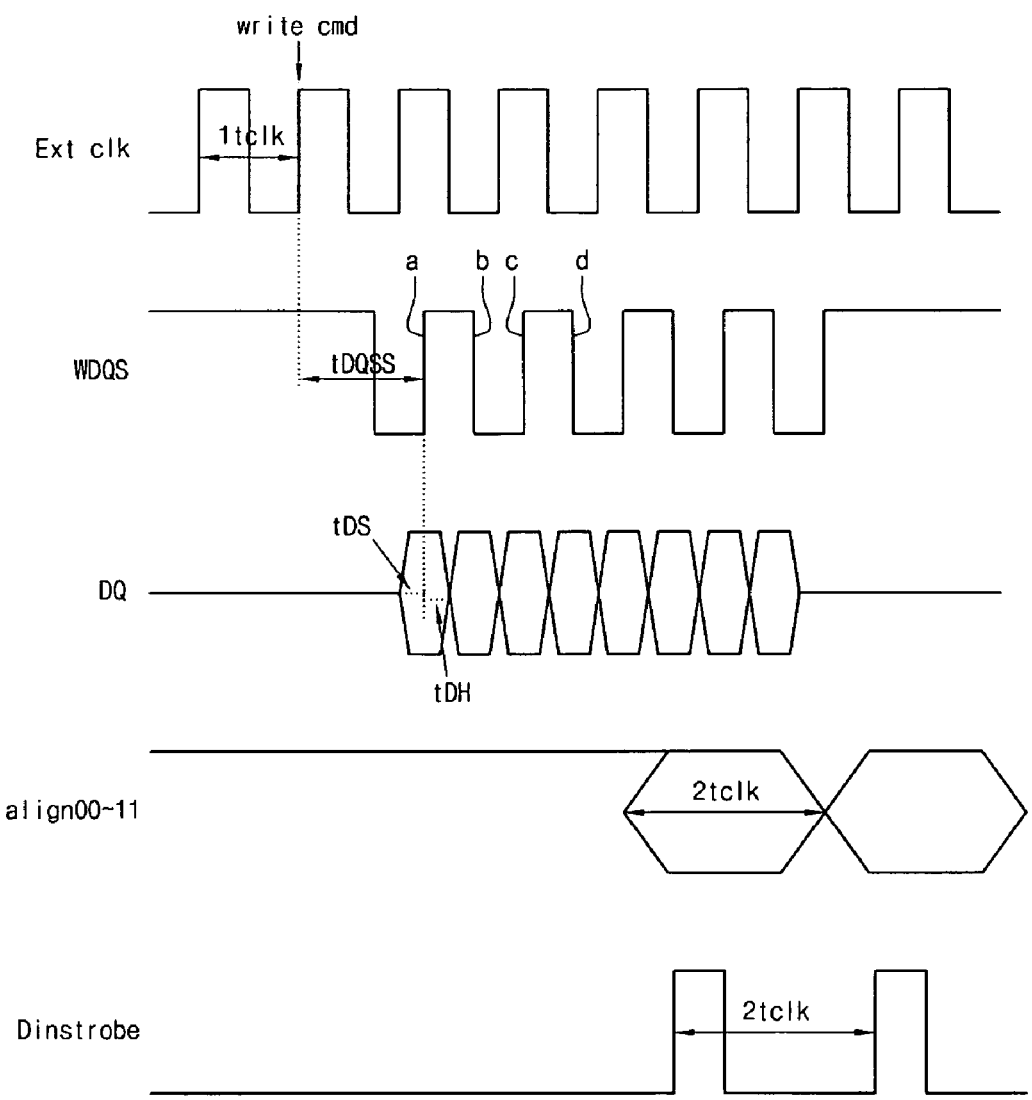
FIG. 2 is a waveform illustrating an operation of a data input unit of the memory device in FIG. 1.
Figure 3A:
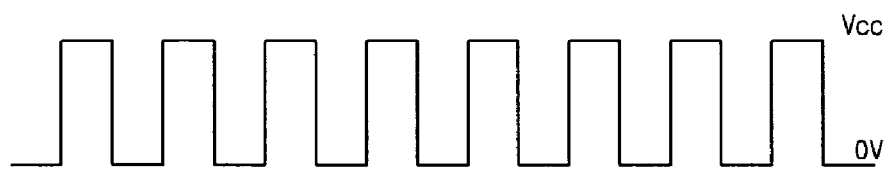
FIGS. 3a and 3b are diagrams illustrating transformation of a clock signal in a high frequency operation.
Figure 3B:
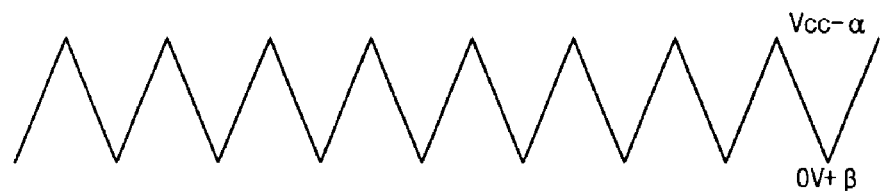
Figure 4:
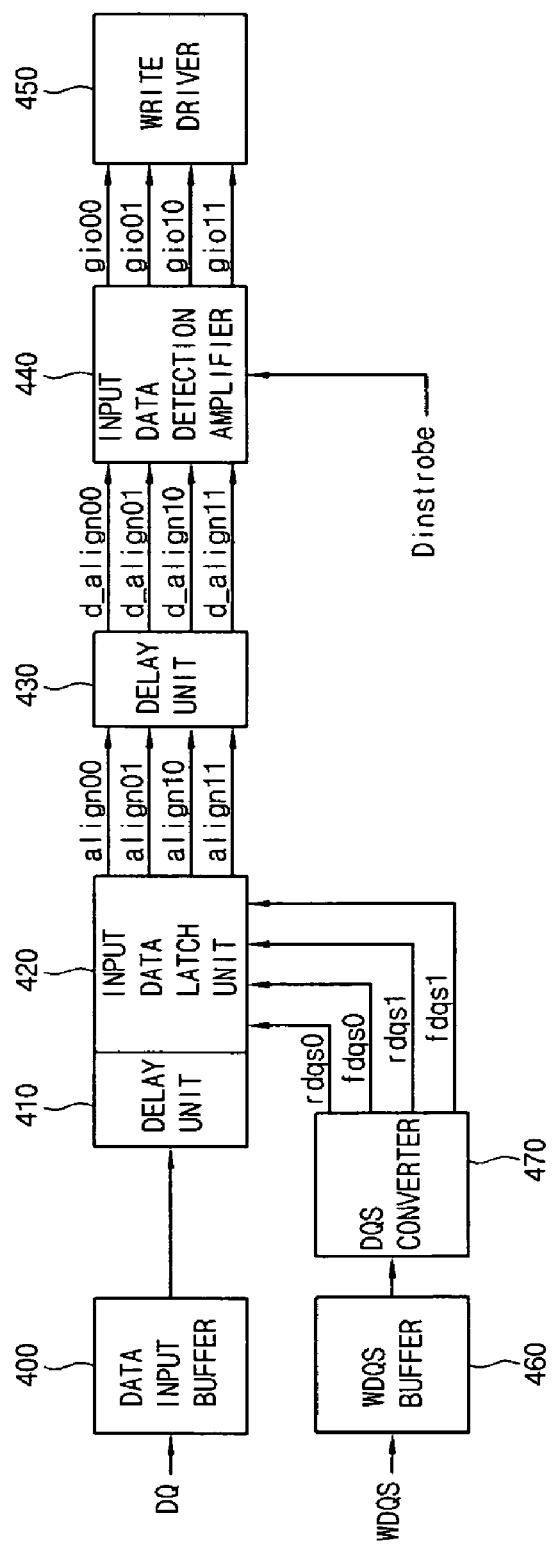
FIG. 4 is a block diagram of a data input unit in a synchronous memory device according to one embodiment of the present invention.

FIG. 4 is a block diagram of a data input unit in a memory device according to one embodiment of the present invention.

A data input buffer 400 is a circuit for converting data inputted through a data pin (DQ) to data of a CMOS level. FIG. 4 shows a case in which data are input through one data pin. Accordingly, a memory device including eight data pins may further include seven data input units, each of which is equal to the data input unit in FIG. 4. In this case, it is preferred to commonly use a WDQS buffer 460 and a DQS converter 470 in all data input units.

A delay unit 410 is a circuit for delaying the data outputted from the data input buffer 400 for a predetermined time period. The delay unit 410 corresponds to a data delay adjustment circuit for matching setup-hold time of data.

An input data latch unit 420 is a circuit for latching the data outputted from the delay unit 410, and latches 4-bit data in a 4-bit prefetch operation.

A delay unit 430 is a circuit for receiving the 4-bit data having passed through the input data latch unit 420, delaying the received 4-bit data for a predetermined time period, and outputting the delayed data. The delay unit 430 compensates for a difference of a tDQSS. It is common that a tDQSS is determined within the range of 0.75 tCK~1.25 tCK. Accordingly, when the tDQSS is later than a reference value set by a user, the delay unit 430 decreases delay time. However, when the tDQSS is earlier than the reference value, the delay unit 430 increases the delay time.

The WDQS buffer 460 is a circuit for converting write strobe signal WDQS applied from a memory controller to a signal of a CMOS level.

Figure 6:
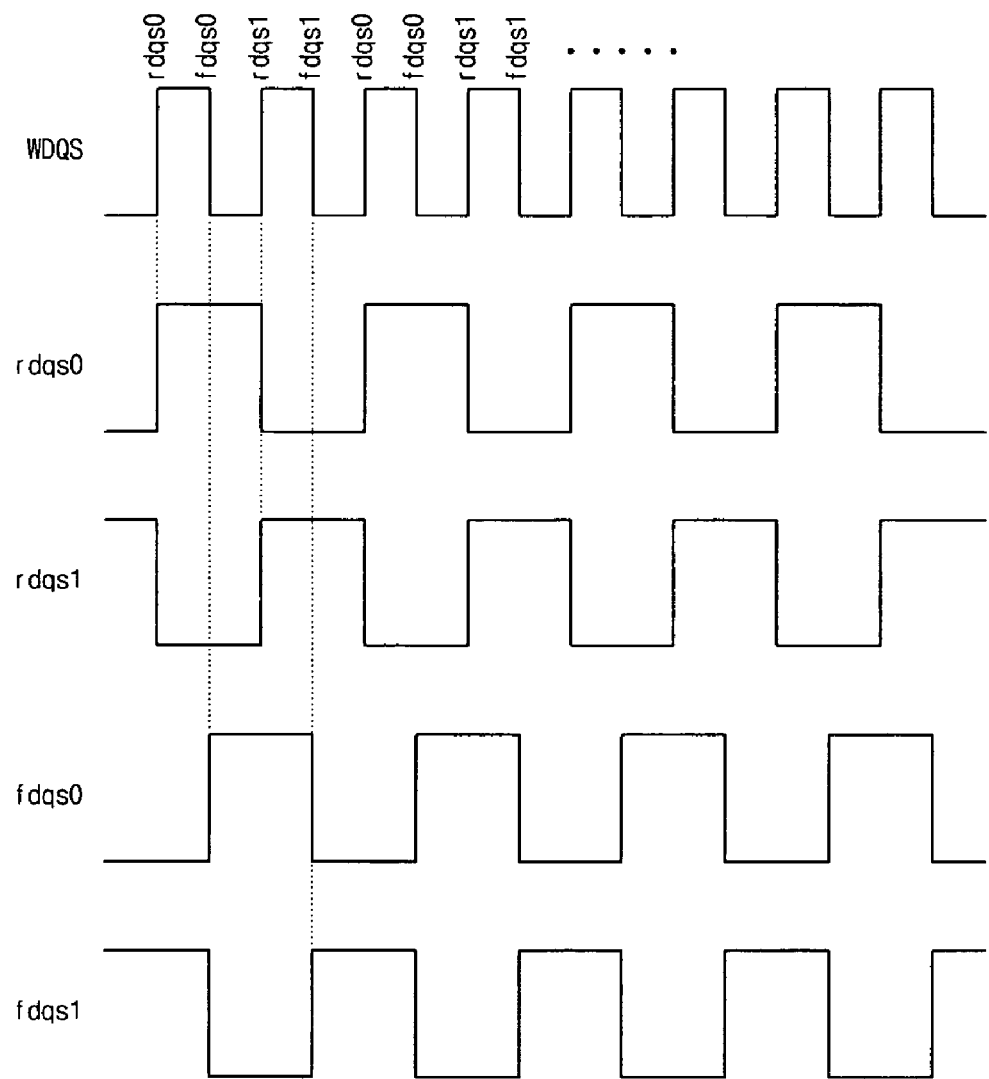
FIG. 6 illustrates waveforms of the control signals in FIG. 5.

The DQS converter 470 receives the data strobe signal WDQS of the CMOS level, which are outputted from the WDQS buffer 460, and generates four types of control signals, i.e. rising strobe signals rdqs0 and rdqs1 and falling strobe signals fdqs0 and fdqs1. The rising strobe signals rdqs0 and rdqs1 and the falling strobe signals fdqs0 and fdqs1 correspond to signals obtained by dividing the data strobe signal WDQS into ½, respectively. The rising edge of the rising strobe signal rdqs0 synchronizes with the first rising edge of the data strobe signal WDQS, the rising edge of the falling strobe signal fdqs0 synchronizes with the first falling edge of the data strobe signal WDQS, the rising edge of the rising strobe signal rdqs1 synchronizes with the second rising edge of the data strobe signal WDQS, and the rising edge of the falling strobe signal fdqs1 synchronizes with the second falling edge of the data strobe signal WDQS. Each of the control signals rdqs0, rdqs1, fdqs0 and fdqs1 has a high level interval maintained for a time period for which a high level interval of the data strobe signal WDQS is maintained. FIG. 6 illustrates waveforms of the signals rdqs0 rdqs1, fdqs0, fdqs1, and WDQS.

The input data latch unit 420 sequentially latches the data which synchronize with the rising edges of the control signals rdqs0, fdqs0, rdqs1, and fdqs1 outputted from the DQS converter 470, and pass through the delay unit 410. In the 4-bit prefetch operation, the 4-bit data synchronize with each of the control signals rdqs0, fdqs0, rdqs1, and fdqs1 and are latched by one bit. If the control signals rdqs0, fdqs0, rdqs1, and fdqs1 are inputted, the 4-bit data stored in the input data latch unit 420 are aligned in parallel, and outputted to the delay unit 430 through internal lines align 00, align 01, align 10 and align 11.

As described above, the delay unit 430 adjusts delay time of the input 4-bit data in consideration of the time tDQSS. The data outputted from the delay unit 430 are synchronized with a data input strobe signal Dinstrobe in the input data detection amplifier 440, are amplified, and then stored in a corresponding memory cell by a write driver 450, respectively.

Figure 5:
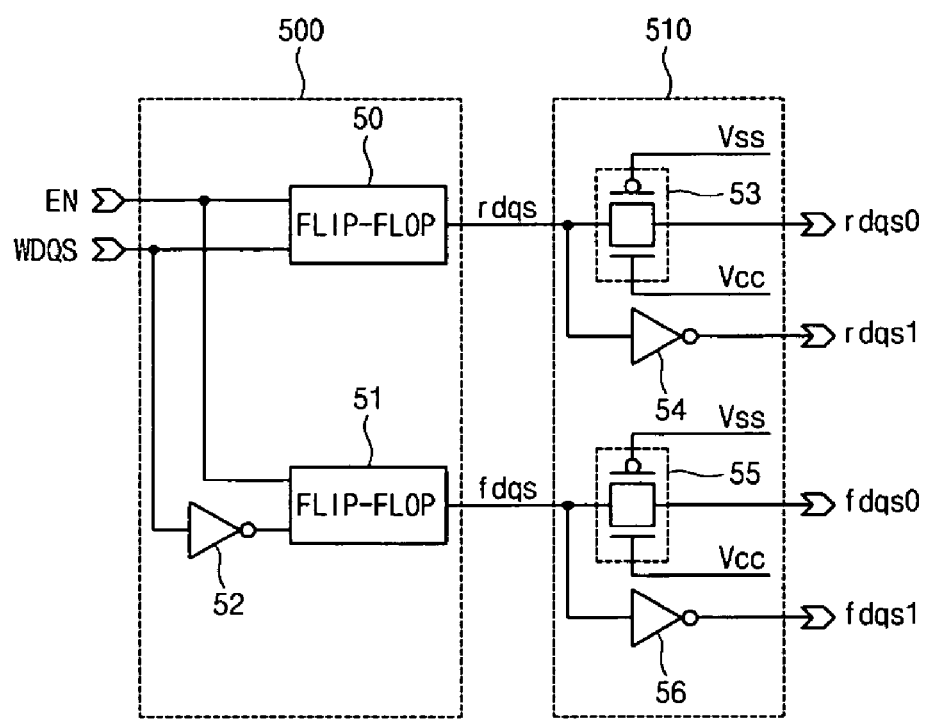
FIG. 5 is a block diagram of the DQS converter in FIG. 4 according to one embodiment of the present invention.

FIG. 5 is a block diagram of the DQS converter 470 in FIG. 4 according to one embodiment of the present invention. The DQS converter 470 includes a first signal generator 500 and a second signal generator 510. The first signal generator 500 includes flip-flops 50 and 51 and an inverter 53, and the second signal generator 510 includes switching elements 53 and 55 and inverters 54 and 56.

In FIG. 5, the flip-flop 50 receives an enable signal EN and the data strobe signal WDQS, and the flip-flop 51 receives the enable signal EN and an inverted data strobe signal WDQS. Each of the output signals rdqs and fdqs of the flip-flops 50 and 51 has a frequency corresponding to ½ of the data strobe signal WDQS. That is, each of the output signals rdqs and fdqs has a period which is two times as long as that of the data strobe signal WDQS. The rising edge of the output signal rdqs synchronizes with the rising edge of the data strobe signal WDQS, the rising edge of the output signal fdqs synchronizes with the falling edge of the data strobe signal WDQS, and the high level intervals of the output signals rdqs and fdqs are maintained for a time period for which the high level interval of the data strobe signal WDQS is maintained.

FIG. 6 illustrates waveforms of the input and output signals of the DQS converter 470 in FIG. 5. The switching element 53 receives the signal rdqs, and outputs the rising strobe signal rdqs0 according to the status of operation voltages Vcc and Vss. The inverter 54 receives the signal rdqs and outputs the rising strobe signal rdqs1. The switching element 55 receives the signal fdqs, and outputs the falling strobe signal fdqs0 according to the status of the operation voltages Vcc and Vss. The inverter 56 receives the signal fdqs and outputs the falling strobe signal fdqs1. Each of the switching elements 53 and 55 is a circuit for matching delay time of each of the inverters 54 and 56.

As described above, in order to latch data sequentially applied through a data pin, a signal WDQS is divided into ½, and 4-bit data are latched by means of four types of control signals obtained by the division. In the prior art, as the operation frequency of a memory device increases, a signal is severely distorted due to RC delay in transmission of control signals. However, according to the present invention, a signal WDQS is divided, so that it is possible to use control signals for data latch also in a high frequency operation. Since a 4-bit prefetch operation is performed, 4-bit data aligned in parallel are applied to the delay unit 430, and then transferred to the input data detection amplifier 440. The delay unit 430 is provided in consideration of the fact that the time tDQSS of a data strobe signal WDQS is not constant. The delay time in the delay unit 430 can be optimally established in consideration of relation with the data input strobe signal Dinstrobe for controlling the input data detection amplifier 440.

Specifically, since the delay unit 430 is provided for adjusting the time tDQSS, the delay unit 430 may be disposed behind the WDQS buffer 460 as in the prior art so long as the delay unit 430 normally operates. That is, the delay unit 430 may be disposed between the WDQS buffer 460 and the DQS converter 470. Herein, in order to prevent a signal from being distorted, the WDQS buffer 460 must maintain a proper distance with the DQS converter 470.

As described above, the present invention provides a scheme for dividing a data strobe signal WDQS for latching data applied in a write operation into ½ and transferring the divided data, thereby preventing a memory device from abnormally operating due to signal distortion.

Further, the present invention can be usefully applied to a high speed synchronous memory device having an operation frequency of more than 500 MHz.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. The data input circuit of the synchronous memory device for detecting and amplifying data, and transferring the amplified data for storage, the data input circuit comprising:
   a write strobe signal converter for receiving a write strobe signal, dividing the received write strobe signal, and outputting control signals of predetermined bits, the control signals being synchronized with rising and falling edges of the divided signal; and
   a latch unit for latching data corresponding to the bits by means of the control signals, and outputting the data for the detection and amplification of the data;
   wherein the write strobe signal converter comprises:
      a first signal generator for dividing the write strobe signal into ½ with reference to the rising and falling edges of the write strobe signal; and
      a second signal generator for generating the control signals respectively synchronized with the rising and falling edges of the divided signal.

2. The data input circuit as claimed in claim 1, wherein the first signal generator comprises:
   a first flip-flop for outputting the signal synchronized with the rising edge of the write strobe signal;
   a first inverter for inverting the write strobe signal; and
   a second flip-flop for receiving the inverted write strobe signal, and outputting the signal synchronized with the falling edge of the write strobe signal.

3. The data input circuit as claimed in claim 1, wherein the second signal generator comprises:
   a second inverter for inverting and outputting the signal synchronized with the rising edge of the write strobe signal;
   a first switching element for delaying the signal synchronized with the rising edge of the write strobe signal by delay time of the second inverter, and outputting the delayed signal;
   a third inverter for inverting and outputting the signal synchronized with the falling edge of the write strobe signal; and
   a second switching element for delaying the signal synchronized with the falling edge of the write strobe signal by delay time of the third inverter, and outputting the delayed signal.

* * * * *